(12) United States Patent
Ramkumar

(10) Patent No.: US 9,196,496 B2
(45) Date of Patent: *Nov. 24, 2015

(54) METHOD OF INTEGRATING A CHARGE-TRAPPING GATE STACK INTO A CMOS FLOW

(71) Applicant: Cypress Semiconductor Corporation, San Jose, CA (US)

(72) Inventor: Krishnaswamy Ramkumar, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/201,456

(22) Filed: Mar. 7, 2014

(65) Prior Publication Data

US 2014/0235046 A1    Aug. 21, 2014

Related U.S. Application Data

(63) Continuation of application No. 13/428,201, filed on Mar. 23, 2012, now Pat. No. 8,685,813.

(60) Provisional application No. 61/599,258, filed on Feb. 15, 2012.

(51) Int. Cl.
  *H01L 21/28* (2006.01)
  *H01L 27/115* (2006.01)
  *H01L 21/8234* (2006.01)

(52) U.S. Cl.
  CPC .... *H01L 21/28282* (2013.01); *H01L 27/11573* (2013.01); *H01L 21/823462* (2013.01)

(58) Field of Classification Search
  USPC ........ 257/314, E29.129, E29.3; 438/201, 211
  See application file for complete search history.

(56) References Cited

U.S. PATENT DOCUMENTS

| | | | |
|---|---|---|---|
| 6,127,227 A | 10/2000 | Lin et al. | |
| 6,297,096 B1 | 10/2001 | Boaz | |
| 6,440,797 B1 | 8/2002 | Wu et al. | |
| 6,946,349 B1 | 9/2005 | Lee et al. | |
| 7,033,890 B2 | 4/2006 | Shone | |
| 7,390,718 B2 | 6/2008 | Roizin et al. | |
| 7,910,429 B2 | 3/2011 | Dong et al. | |
| 2006/0017092 A1 | 1/2006 | Dong et al. | |
| 2008/0290400 A1 | 11/2008 | Jenne et al. | |
| 2009/0179253 A1 | 7/2009 | Levy et al. | |
| 2011/0237060 A1 | 9/2011 | Lee et al. | |

OTHER PUBLICATIONS

USPTO Notice of Allowance for U.S. Appl. No. 13/428,201 dated Aug. 5, 2013; 12 pages.

(Continued)

*Primary Examiner* — Kyoung Lee
*Assistant Examiner* — Ratisha Mehta

(57) ABSTRACT

A method of fabricating a memory device is described. Generally, the method includes: forming on a surface of a substrate a dielectric stack including a tunneling dielectric and a charge-trapping layer overlying the tunneling dielectric; forming a cap layer overlying the dielectric stack, wherein the cap layer comprises a multi-layer cap layer including at least a first cap layer overlying the charge-trapping layer, and a second cap layer overlying the first cap layer; patterning the cap layer and the dielectric stack to form a gate stack of a memory device; removing the second cap layer; and performing an oxidation process to oxidize the first cap layer to form a blocking oxide overlying the charge-trapping layer, wherein the oxidation process consumes the first cap layer. Other embodiments are also described.

20 Claims, 12 Drawing Sheets

(56) References Cited

OTHER PUBLICATIONS

USPTO Notice of Allowance for U.S. Appl. No. 13/428,201 dated Oct. 4, 2013; 11 pages.
USPTO Notice of Allowance for U.S. Appl. No. 13/428,201 dated Dec. 30, 2013; 11 pages.
Hua-Ching Chien, Chin-Hsing Kao, Jui-Wen Chang and Tzung-Kuen Tsai_Two-bit SONOS type Flash using a band engineering in the nitride layer_Dated Jun. 17, 2005_4 pages.
Krishnaswamy Ramkumar_Cypress SONOS Technology_Dated Jul. 6, 2011_9 pages.
SIPO Office Action for Chinese Application No. 201210327771.2 dated Jun. 6, 2014; 3 pages.

METHOD OF INTEGRATING A CHARGE-TRAPPING GATE STACK INTO A CMOS FLOW

RELATED APPLICATIONS

This application is a continuation of U.S. patent application Ser. No. 13/428,201, filed Mar. 23, 2012, which claims priority to U.S. Provisional Patent Application No. 61/599,258, filed Feb. 15, 2012, all of which are incorporated by reference herein in their entirety.

TECHNICAL FIELD

The present disclosure relates generally to the field of semiconductor devices, and more particularly to methods of integrating a charge-trapping gate stack into a CMOS flow.

BACKGROUND

Integrated circuits including logic devices and interface circuits based upon metal-oxide-semiconductor field-effect transistors (MOSFETs) are typically fabricated using a standard complimentary-metal-oxide-semiconductor (CMOS) process flows, involving the formation and patterning of conducting, semiconducting and dielectric materials. The composition of these materials, as well as the composition and concentration of processing reagents, and temperature used in such a CMOS process flow are stringently controlled for each operation to ensure the resultant MOSFETs will function properly. For many applications it is desirable to include non-volatile memory devices based upon FETs including charge-trapping gate stacks in the integrated circuit. Charge-trapping gate stack formation involves the formation of a nitride or oxynitride charge-trapping layer sandwiched between two dielectric or oxide layers typically fabricated using materials and processes that differ significantly from those of the standard CMOS process flow, and which can detrimentally impact or be impacted by the fabrication of the MOSFETs. In particular, forming a gate oxide or dielectric of a MOSFET can significantly degrade performance of a previously formed charge-trapping gate stack by altering a thickness or composition of the charge-trapping layer.

BRIEF DESCRIPTION OF THE DRAWINGS

These and various other features of methods of integrating formation of a charge-trapping gate stack into a CMOS flow will be apparent upon reading of the following detailed description in conjunction with the accompanying drawings and the appended claims provided below, where:

DETAILED DESCRIPTION

Figure 1A:
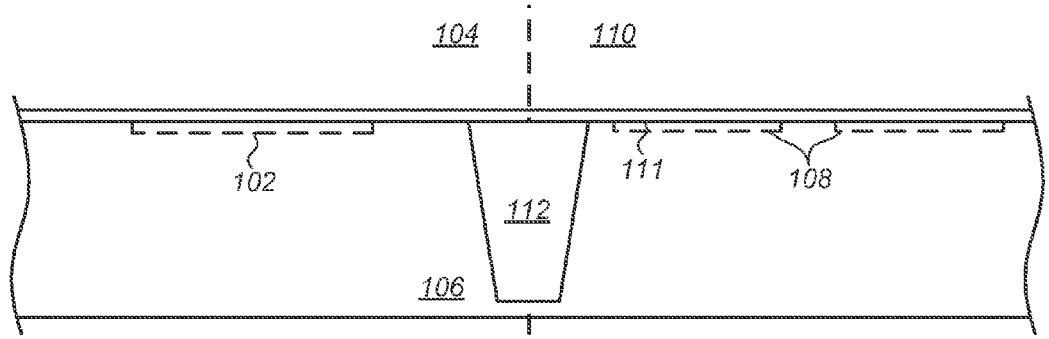
FIGS. 1a-1q are block diagrams illustrating an embodiment of a method of fabricating an integrated circuit including a metal-oxide-semiconductor field-effect transistors (MOSFET) and a non-volatile memory device including a charge-trapping gate stack.

Embodiments of the present invention disclose methods of integrating a charge-trapping gate stack into a CMOS flow. In the following description, numerous specific details are set forth, such as specific configurations, compositions, and processes, etc., in order to provide a thorough understanding of the present invention. In other instances, well-known processes and manufacturing techniques have not been described in particular detail in order to not unnecessarily obscure the present invention. Furthermore, it is to be understood that the various embodiments shown in the Figures are illustrative representations and are not necessarily drawn to scale.

The terms "above," "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

A method of integrating a memory device including a charge-trapping gate stack into a CMOS flow is described. In an embodiment, the method begins with forming a channel of the memory device in a first region of a substrate and a channel of a MOS device in a second region. Next, a dielectric stack is formed on a surface of the substrate overlying at least the channel of the memory device, the dielectric stack including a tunneling dielectric overlying the surface of the substrate and a charge-trapping layer overlying the tunneling dielectric, and a cap layer formed overlying the dielectric stack. The cap layer and the dielectric stack are patterned to form a gate stack overlying the channel of the memory device and to remove the cap layer and the dielectric stack from the second region of the substrate. Finally, an oxidation process is performed to form a gate oxide overlying the channel of the MOS device in the second region while simultaneously oxidizing the cap layer to form a blocking oxide overlying the charge-trapping layer. The oxidation process can include in-situ-steam-generation (ISSG), chemical vapor deposition (CVD), or radical oxidation performed in a batch or single substrate processing chamber with or without an ignition event such as plasma. Generally, the oxidation process consumes substantially the entire cap layer, as well as a portion of the charge trapping layer.

In certain embodiments, the cap layer is a multi-layer cap layer including a first cap layer adjacent to the charge-trapping layer and a second cap layer overlying the first cap layer. The first and second cap layers can include nitride layer having differing stoichiometry composition. The second cap layer is removed in a clean process, such as a wet clean process, after patterning the dielectric stack and prior to performing the oxidation process, and the first cap layer is consumed in the oxidation process.

In other embodiments, an oxide layer or sacrificial oxide is formed over the second cap layer prior to patterning and both the sacrificial oxide and second cap layer are removed during a wet clean process.

An embodiment of a method for integrating a circuit including a metal-oxide-semiconductor field-effect transistor (MOSFET) and a non-volatile memory device including a charge-trapping gate stack will now be described in detail with reference to FIGS. 1A through 1q.

Referring to FIG. 1a, the process begins with forming a channel 102 for a memory device in a first region 104 of a substrate 106 and channels 108 for one or more MOS devices in a second region 110 of the substrate. The substrate 106 may be a bulk wafer composed of any single crystal material suitable for semiconductor device fabrication, or may include a top epitaxial layer of a suitable material formed on a substrate. Suitable materials include, but are not limited to, silicon, germanium, silicon-germanium or a III-V compound semiconductor material.

Generally, the channels 102, 108, are formed by implantation of appropriate ion species through a pad oxide 111 in both the first region 104 and the second region 110. For example, $BF_2$ can be implanted at an energy of from about 5 to about 100 kilo-electron volts (keV), and a dose of from about 1e14 $cm^{-2}$ to about 1e16 $cm^{-2}$ to form an N-type non-volatile memory device. A P-type device may likewise be formed by implantation of Arsenic or Phosphorous ions at any suitable dose and energy. It is to be appreciated that implantation can be used to form channels 102, 108, in both regions of the substrate 106 at the same time, or at separate times using standard lithographic techniques, including a patterned photoresist layer to mask one of the regions. The pad oxide 111 is silicon dioxide ($SiO_2$) having a thickness of from about 10 nanometers (nm) to about 20 nm and can be grown by a thermal oxidation process or in-situ steam generation (ISSG).

In some embodiments, such as that shown, isolation structures 112 may be formed in the substrate 106 to electrically isolate a memory device formed in the first region 104 from a MOS device formed in the second region 110. Isolation structures 112 are formed prior to forming the pad oxide 111 and channels 102, 108, and may be formed by any conventional technique, such as, but not limited to shallow trench isolation (STI) or local oxidation of silicon (LOCOS).

Figure 1B:
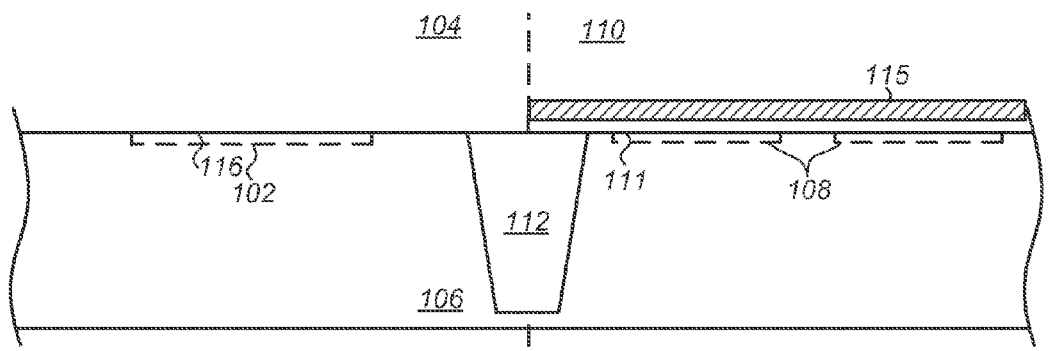

Next, referring to FIG. 1b a patterned mask layer 115 is formed on or overlying the pad oxide 111 and the pad oxide etched or patterned to remove the oxide from the first region 104 of the substrate 106. The patterned mask layer 115 can include a photoresist layer patterned using standard lithographic techniques, and the pad oxide 111 can be etched or removed using a wet or dry etch process to stop on a surface of the substrate 106. In one exemplary embodiment, the pad oxide 111 is removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 1C:
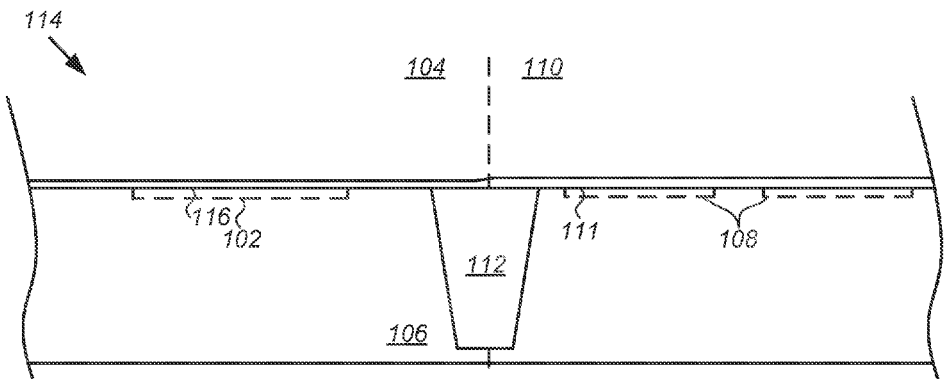

Referring to FIG. 1c, a dielectric stack 114 is formed, beginning with the formation of a tunnel dielectric 116 over at least the channel 102 of the memory device in the first region 104 of the substrate 106. The tunnel dielectric 116 may be any material and have any thickness suitable to allow charge carriers to tunnel into the charge trapping layer under an applied gate bias while maintaining a suitable barrier to leakage when the memory device is unbiased. In certain embodiments, tunnel dielectric 116 is silicon dioxide, silicon oxy-nitride, or a combination thereof and can be grown by a thermal oxidation process, in-situ steam generation (ISSG), or radical oxidation.

For example, in one embodiment a silicon dioxide tunnel dielectric 116 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of ~900-1000° C. at a pressure approximately in the range of 0.5-5 Torr to form radicals, such as, an OH radical, an $HO_2$ radical or an O diradical, at the surface of substrate. The radical oxidation process is carried out for a duration approximately in the range of 1-10 minutes to effect growth of a tunnel dielectric 116 having a thickness of from about 1.5 nanometers (nm) to about 3.0 nm by oxidation and consumption of the exposed surface of substrate. It will be understood that in this and in subsequent figures the thickness of tunnel dielectric 116 is exaggerated relative to the pad oxide 111, which is approximately 7 times thicker, for the purposes of clarity. A tunnel dielectric 116 grown in a radical oxidation process is both denser and is composed of substantially fewer hydrogen atoms/$cm^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 116 without impacting the throughput (wafers/hr.) requirements that a fabrication facility may require.

In another embodiment, tunnel dielectric layer 116 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunnel dielectric 116 is a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Figure 1D:
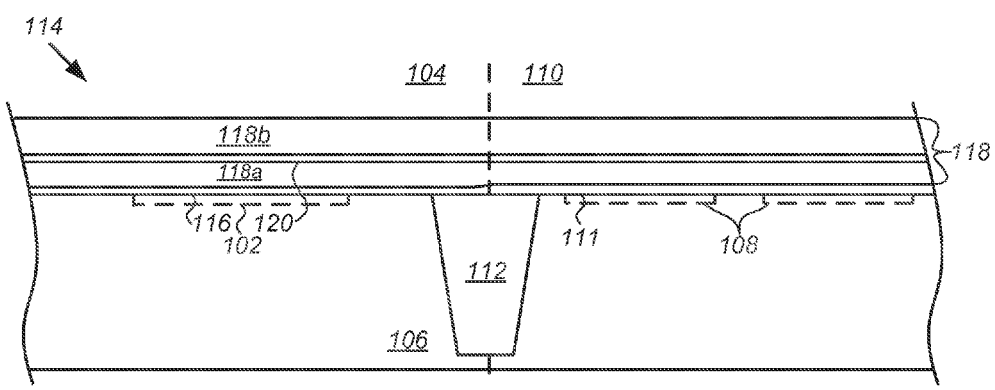

Referring to FIG. 1d, a charge-trapping layer 118 is formed on or overlying the tunnel dielectric 116. Generally, as in the embodiment shown, the charge-trapping layer 118 is a multi-layer charge-trapping layer including at least a lower or first charge-trapping layer 118a closer to the tunnel dielectric 116, and an second charge-trapping layer 118b that is oxygen-lean relative to the first charge-trapping layer and comprises a majority of a charge traps distributed in multi-layer charge-trapping layer.

The first charge-trapping layer 118a of a multi-layer charge-trapping layer 118 can include a silicon nitride ($Si_3N_4$), silicon-rich silicon nitride or a silicon oxy-nitride ($SiO_xN_y(H_z)$). For example, the first charge-trapping layer 118a can include a silicon oxynitride layer having a thickness of between 2.0 nm and 4.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 118b of the multi-layer charge-trapping layer 118 is then formed over the first charge-trapping layer 118a. The second charge-trapping layer 118b can include a silicon nitride and silicon oxy-nitride layer having a stoichiometric composition of oxygen, nitrogen and/or silicon different from that of the first charge-trapping layer 118a. The second charge-trapping layer 118b can include a silicon oxynitride layer having a thickness of between 2.0 nm and 5.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt. % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt. % of silicon with less oxygen than an "oxygen-rich" film. A silicon-rich silicon oxynitride film is therefore more like silicon and the RI is increased toward the 3.5 RI of pure silicon.

In some embodiments, the multi-layer charge-trapping layer 118 is a split charge-trapping layer, further including a thin, middle oxide layer 120 separating the first charge-trapping layer 118a and the second charge-trapping layer 118b. The middle oxide layer 120 substantially reduces the probability of electron charge that accumulates at the boundaries of the second charge-trapping layer 118b during programming from tunneling into the first charge-trapping layer 118a, resulting in lower leakage current than for the conventional memory devices.

In one embodiment, the middle oxide layer 120 is formed by oxidizing to a chosen depth using thermal or radical oxidation. Radical oxidation may be performed, for example, at a temperature of 1000-1100° C. using a single wafer tool, or 800-900° C. using a batch reactor tool. A mixture of $H_2$ and $O_2$ gasses may be introduced to a process chamber at a ratio of approximately 1:1 and a pressure of 300-500 Tor for a batch process, or 10-15 Tor using a single vapor tool, for a time of 1-2 minutes using a single wafer tool, or 30 min to 1 hour using a batch process. In some embodiments, the radical oxidation process is without an ignition event, such as forming of a plasma, which would otherwise typically be used to pyrolyze the $H_2$ and $O_2$ to form steam. Instead, the $H_2$ and $O_2$ are permitted to react at a surface of the first charge-trapping layer 118a to form radicals, such as, an OH radical, an $HO_2$ radical or an O diradical, to form the middle oxide layer 120.

Figure 1E:
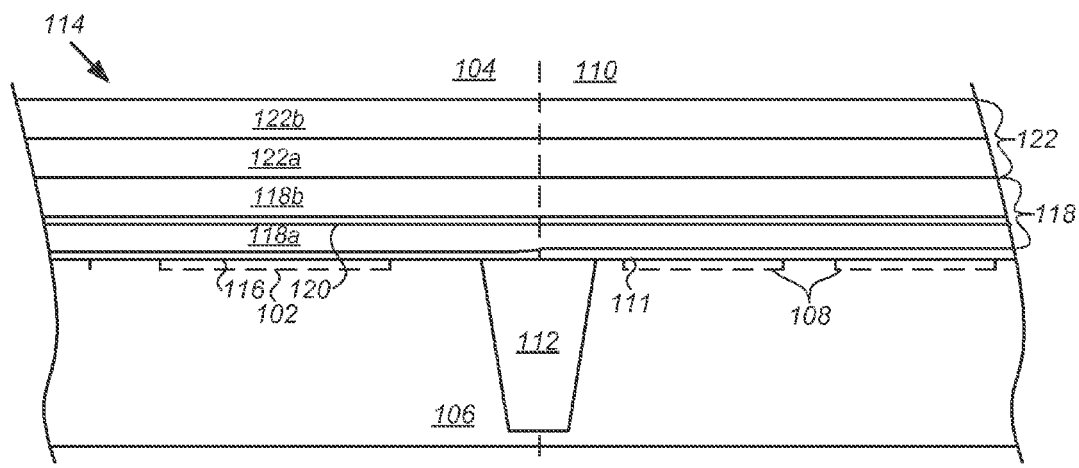

Referring to FIG. 1e, a cap layer 122 is formed on or overlying the dielectric stack 114 or the charge-trapping layer 118. In one embodiment, the cap layer 122 includes a silicon nitride all or part of which is subsequently oxidized in a later step to form a blocking oxide overlying the charge-trapping layer 118. The cap layer 122 can be a single layer of nitride having a homogeneous composition, a single layer of nitride having a gradient in stoichiometric composition, or, as in the embodiment shown, can be a multi-layer cap layer including at least a lower or first cap layer 122a overlying the charge-trapping layer 118, and a second cap layer 122b overlying the first cap layer 122a.

In one embodiment, the first cap layer 122a can include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. Similarly, the second cap layer 122b can also include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. Optionally, the first cap layer 122a and second cap layer 122b can comprise different stoichiometries. For example, the second cap layer 122b can comprise a silicon or oxygen rich composition relative to the first cap layer 122a to facilitate removal of the second cap layer in a dry or wet clean process prior to oxidizing the first cap layer. Alternatively, the first cap layer 122a can comprise a silicon or oxygen rich composition relative to the second cap layer 122b to facilitate oxidation of the first cap layer.

Figure 1F:
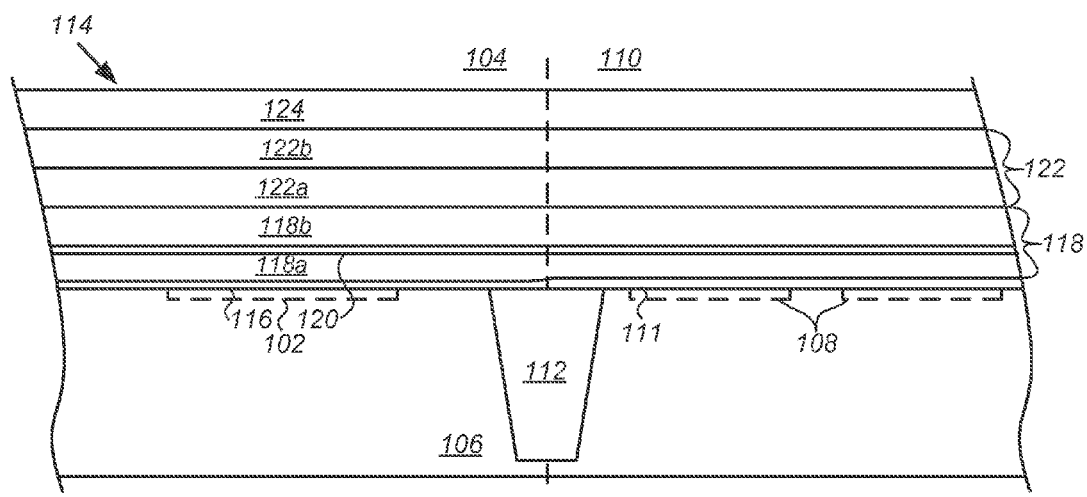

Referring to FIG. 1f, a sacrificial oxide layer 124 is formed on or overlying the dielectric stack 114 or the cap layer 122. In one embodiment, the sacrificial oxide layer 124 can include a silicon dioxide layer grown by a thermal oxidation process, in-situ steam generation (ISSG), or radical oxidation, and having a thickness of between 2.0 nm and 4.0 nm. In another embodiment, the sacrificial oxide layer 124 can be formed or deposited by a chemical vapor deposition process in a low pressure chemical vapor deposition (LPCVD) chamber. For example, the sacrificial oxide layer 124 can be deposited by a CVD process using a process gas including gas mixtures of silane or DCS and an oxygen containing gas, such as $O_2$ or $N_2O$, in ratios and at flow rates tailored to provide a silicon dioxide ($SiO_2$) sacrificial oxide layer.

Figure 1G:
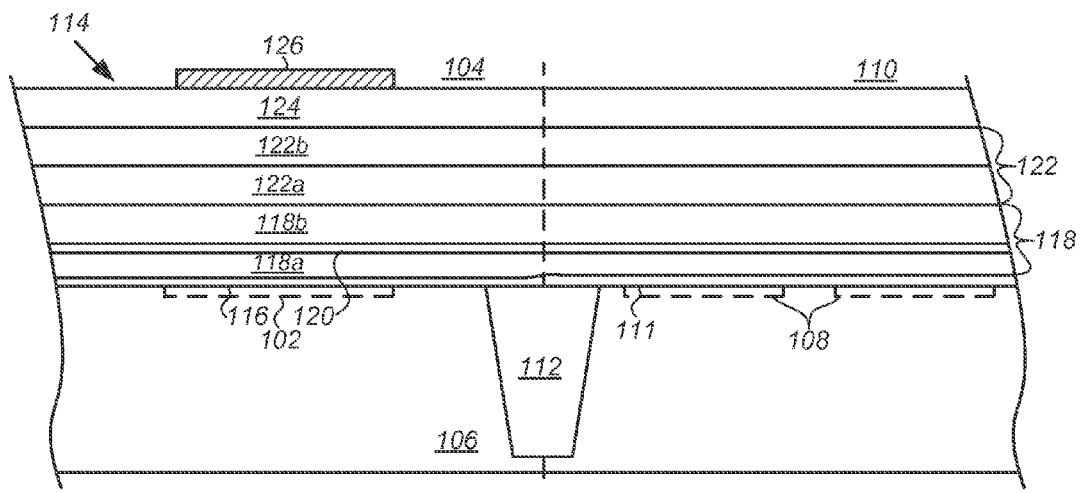
Figure 1H:
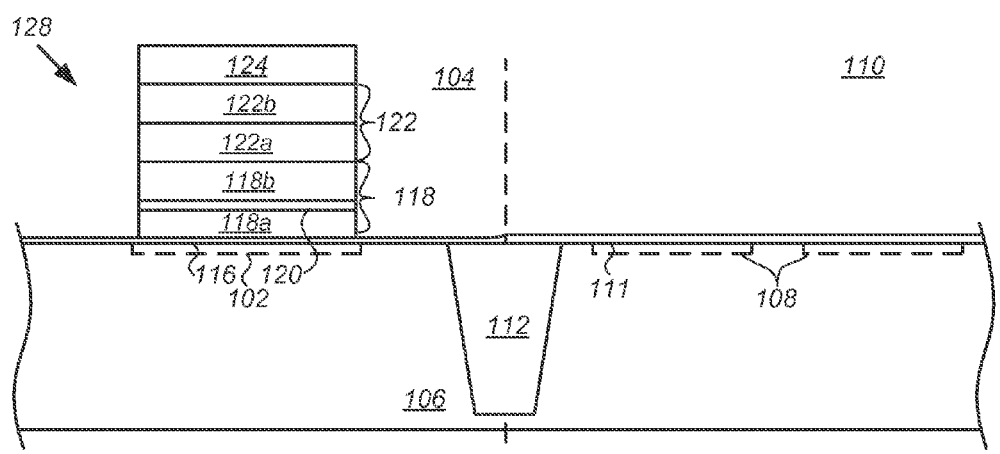

Next, referring to FIG. 1g, a patterned mask layer 126 is formed on or overlying the sacrificial oxide layer 124, and, referring to FIG. 1h, the sacrificial oxide, cap layer 122 and the dielectric stack 114 etched or patterned to form a gate stack 128 overlying the channel 102 of the memory device and to remove the sacrificial oxide, cap layer and the dielectric stack from the second region 110 of the substrate 106. The patterned mask layer 126 can include a photoresist layer patterned using standard lithographic techniques, and the sacrificial oxide 124, cap layer 122 and dielectric stack 114 can be etched or removed using a the dry etch process including one or more separate steps to stop on a surface of the tunnel dielectric 116 and the pad oxide 111.

Figure 1I:
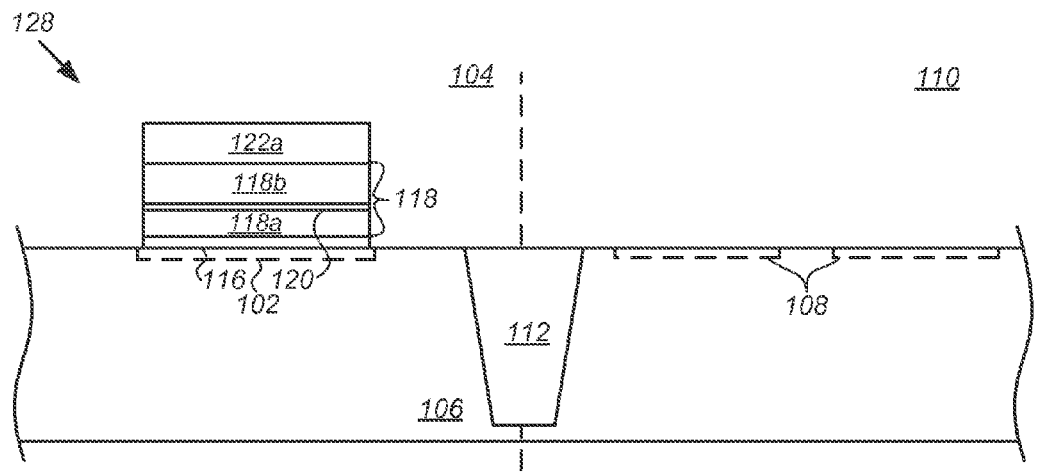

Referring to FIG. 1i, the sacrificial oxide 124 and a portion of the cap layer 122 or substantially of all of a top most layer in a multi-layer cap layer are removed from the gate stack 128 in a highly selective cleaning process. This cleaning process further removes any oxide, such as an oxide tunnel dielectric 116 and pad oxide 111, remaining in the first region 104 outside the gate stack 128 and in the second region 110 to prepare the substrate 106 in that region for gate oxide growth. In one exemplary implementation the sacrificial oxide 124 and the second cap layer 122b are removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 1J:
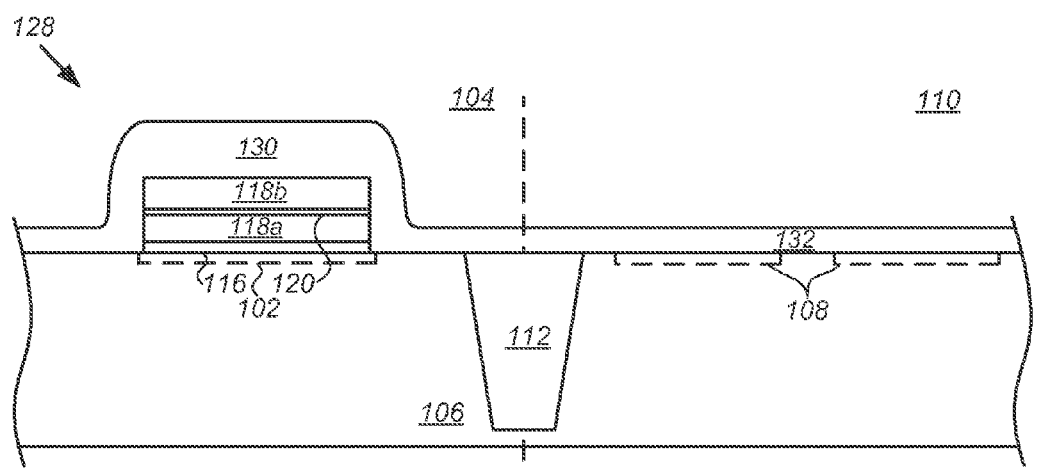

Next, referring to FIG. 1j, an oxidation process is performed to oxidize the remaining portion of the cap layer 122 or the first cap layer 122a of a multi-layer cap layer, and a portion of the second charge-trapping layer 118b to form a blocking oxide layer 130 overlying the second charge-trapping layer. In one embodiment, the oxidation process is adapted to oxidize the first cap layer 122a to form the blocking oxide layer 130 while simultaneously oxidizing at least a portion of a surface of the substrate 106 in the second region 110 to form a first gate oxide 132 overlying at least the channel 108 of at least one MOS device. The oxidation process can include in-situ-steam-generation (ISSG), CVD, or radical oxidation performed in a batch or single substrate processing chamber with or without an ignition event such as plasma. For example, in one embodiment the blocking oxide layer 130 and the gate oxide 132 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 700-800° C. at a pressure approximately in the range of 0.5-5 Torr to form radicals, such as, an OH radical, an $HO_2$ radical or an O diradical radicals at a surface of the cap layer 122 or the first cap layer 122a. The radical oxidation process is carried out for a duration approximately in the range of 10-15 minutes to effect growth of a blocking oxide layer 130 by oxidation and consumption of the first cap layer 122a and a portion of the second charge-trapping layer 118b having a thickness of from about 3 nm to about 4.5 nm, and gate oxide 132 having a thickness of from about 5 nm to about 7 nm.

Figure 1K:
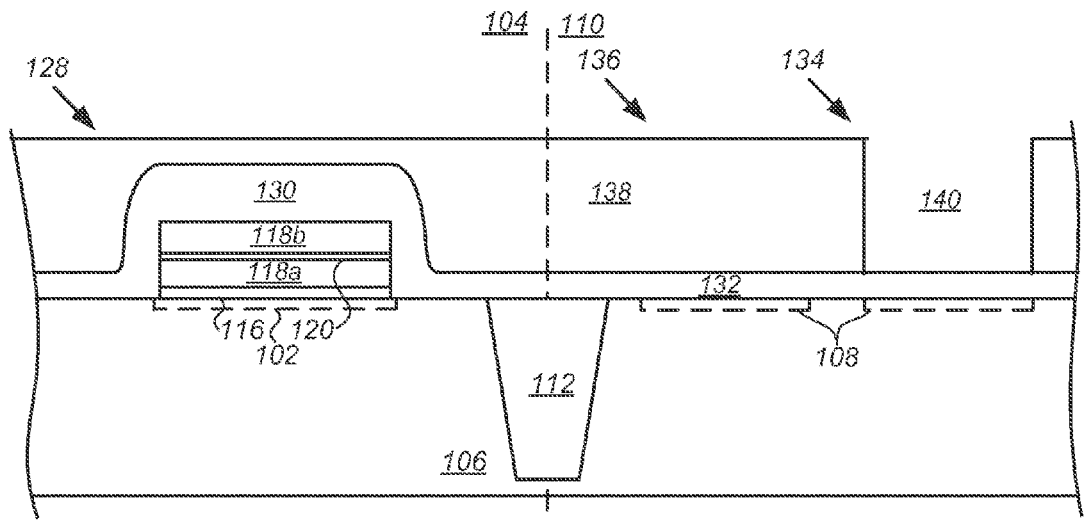

In some embodiments, such as that shown in FIGS. 1k to 1q, the method further includes a dual gate oxide process flow to enable fabrication of both a MOS device 134 and a HV MOS device 136. Referring to FIG. 1k, a patterned mask layer 138 is formed over the first and second regions 104, 110 of the substrate 106. The patterned mask layer 138 can be a photoresist layer patterned using standard lithographic techniques, and includes at least one opening 140 over a channel 108 in the second region 110. The thick, first gate oxide 132 is etched in the exposed regions by using a BOE etch, under conditions similar to those described above with respect to removing the sacrificial oxide 124, and the patterned mask layer 138 is then removed.

Figure 1L:
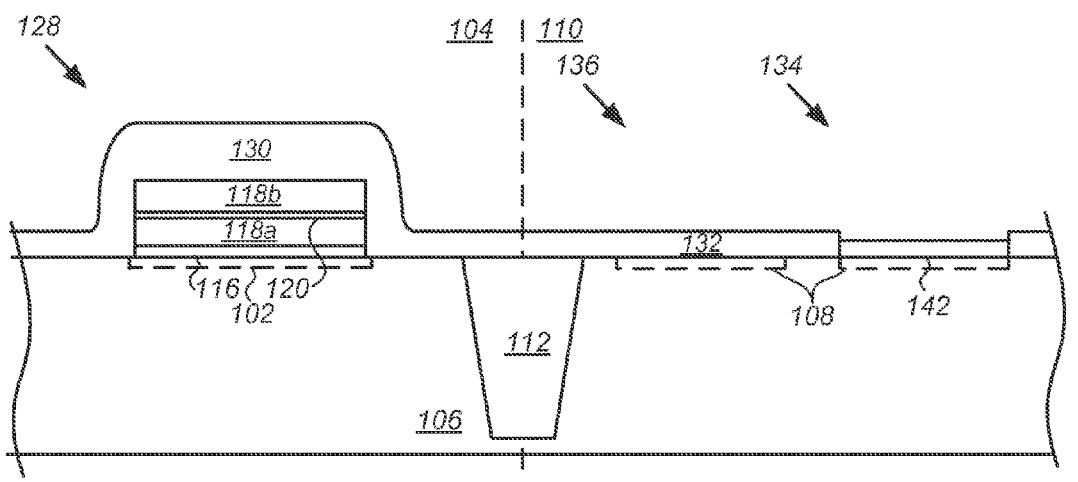

Referring to FIG. 1l, the substrate 106 is cleaned using a wet etch that does not etch oxide in order to protect the first gate oxide 132 of the HV MOS device 136, and the second gate oxide 142 of the gate stack 128 and the first gate oxide 132. The substrate 106 is then subjected to a thermal oxidation process to grow a thin, second gate oxide 142 having a thickness from about 1.5 nm to about 3 nm.

Figure 1M:
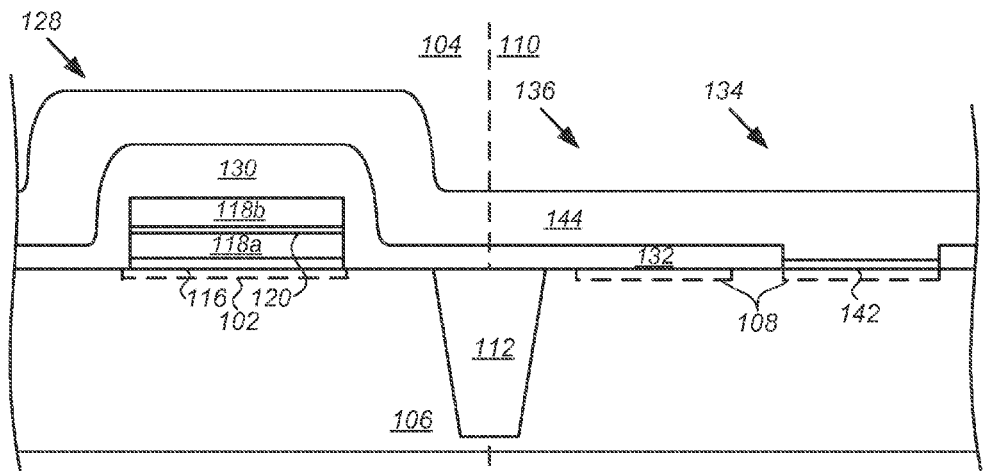

Referring to FIG. 1m, a gate layer 144 of any conducting or semiconducting material suitable for accommodating a biasing of the memory device and operation of the MOS device is formed over the gate stack 128, the first gate oxide 132 of the HV MOS device 136, and the second gate oxide 142 of the MOS device 134. In one embodiment, the gate layer is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, the gate layer is formed by a CVD process and is composed of doped poly-crystalline silicon.

Figure 1N:
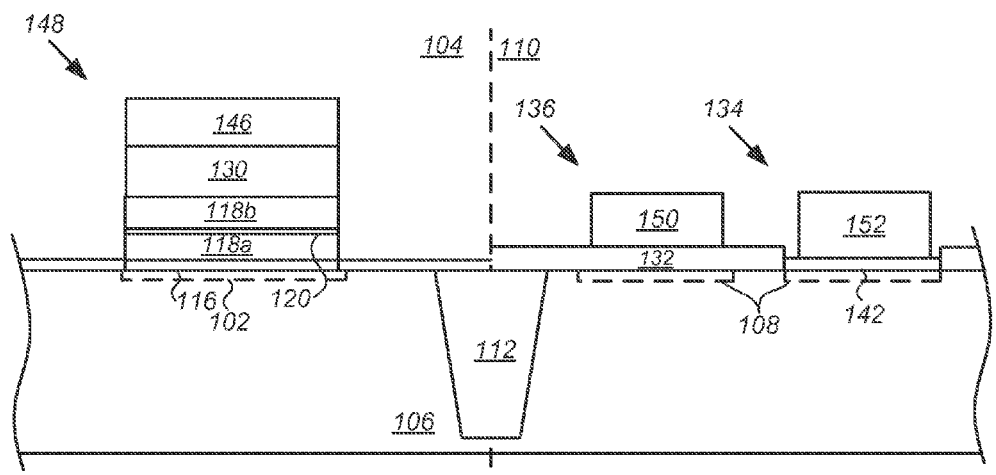

Referring to FIG. 1n, the gate layer 144 is patterned using a mask layer (not shown) and standard lithographic techniques to stop on surfaces of the blocking oxide layer 130, the first gate oxide 132 and the second gate oxide 142, thereby forming a gate 146 for the gate stack 128 of a memory device 148, a gate 150 for the HV MOS device 136, and a gate 152 for the MOS device 134.

Figure 1O:
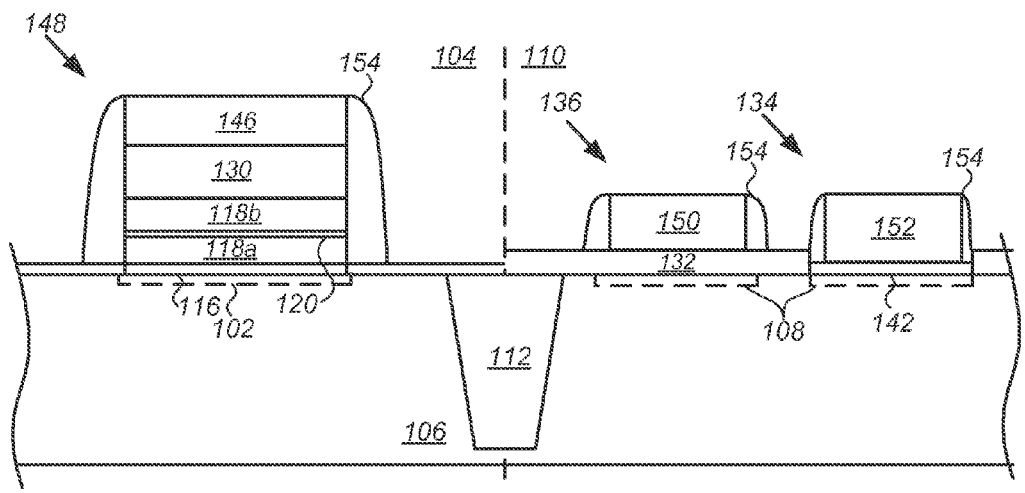
Figure 1P:
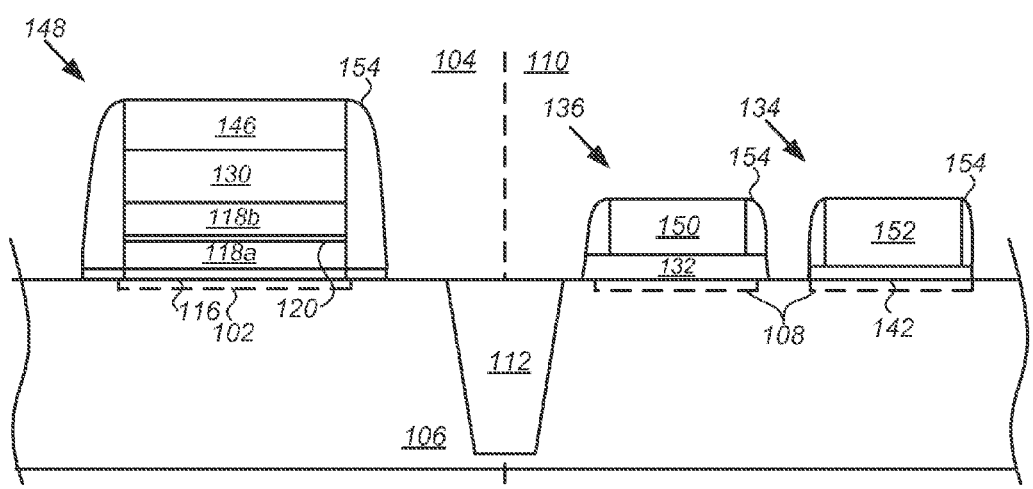
Figure 1G:
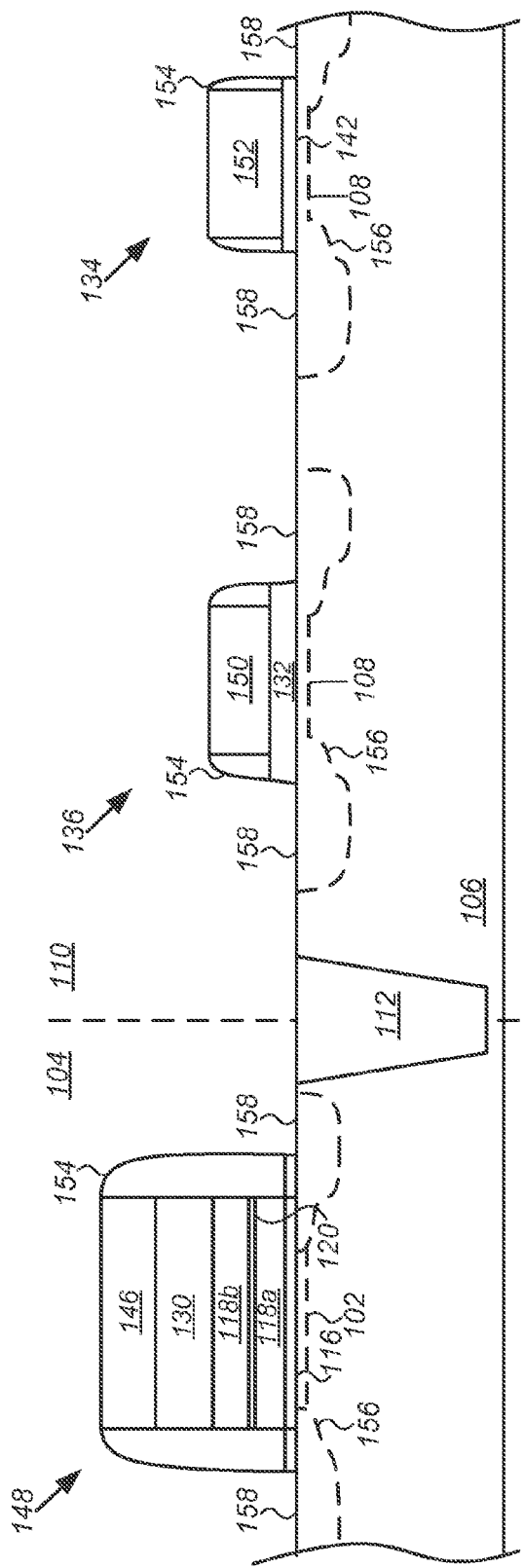

Referring to FIG. 1o, sidewall spacers 154 formed adjacent to the gates 146, 150, 152, for all devices, and remaining exposed portions of the blocking oxide layer 130, the first gate oxide 132 and the second gate oxide 142, anisotropically etched to yield the structure shown in FIG. 1p with substantially complete memory device 148, HV MOS device 136 and MOS device 134.

Referring to FIG. 1q, with the gate stack of the memory device 148, HV MOS device 136 and MOS device 134 substantially complete, tip and/or HALO implants may be performed to form extension regions 156, source and drain implants performed to form source and drain regions 158 for all devices.

Implementations and Alternatives

In another aspect the present disclosure is directed to multigate or multigate-surface memory devices including charge-trapping regions overlying two or more sides of a channel formed on or above a surface of a substrate, and methods of fabricating the same. A non-planar multigate device generally includes a horizontal or vertical channel formed on or above a surface of a substrate and surrounded on three or more sides by a gate.

Figure 2A:
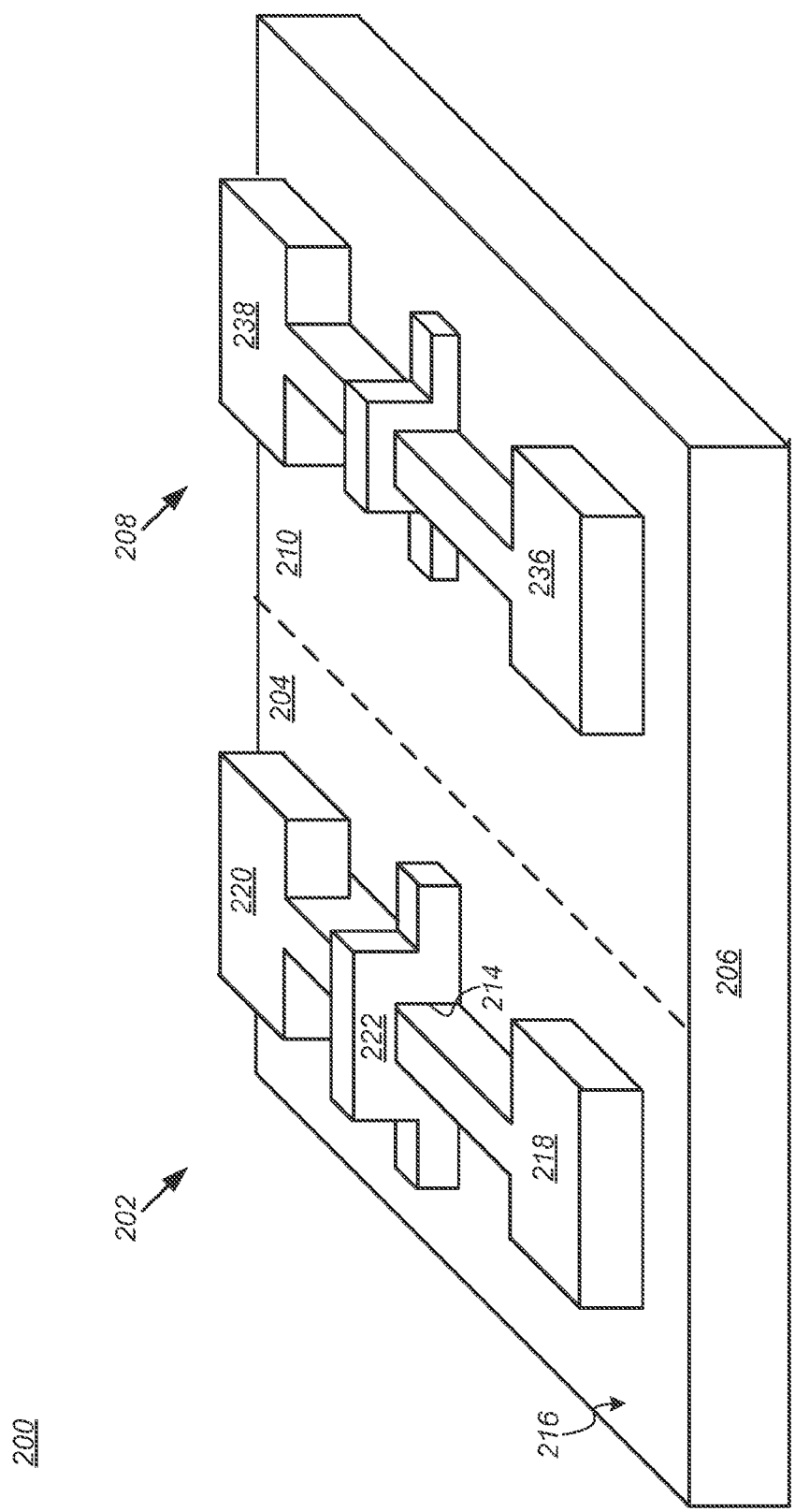
FIGS. 2A and 2B are block diagrams illustrating an integrated circuit including a MOSFET and a non-planar, multi-gate non-volatile memory device fabricated according to another embodiment of the present disclosure.

FIG. 2A illustrates one embodiment of an integrated circuit 200 including a non-planar multigate memory device 202 formed above a first region 204 of a substrate 206, and a MOS device 208 integrally formed adjacent thereto in a second region 210.

Referring to FIG. 2A, the memory device 202, commonly referred to as a finFET, includes a channel 214 formed from a thin film or layer of semiconducting material overlying a surface 216 on the substrate 206 connecting a source 218 and a drain 220 of the memory device. The channel 214 is enclosed on three sides by a fin which forms a gate stack 222 of the device. The thickness of the gate stack 222 (measured in the direction from source to drain) determines the effective channel length of the device.

Figure 2B:
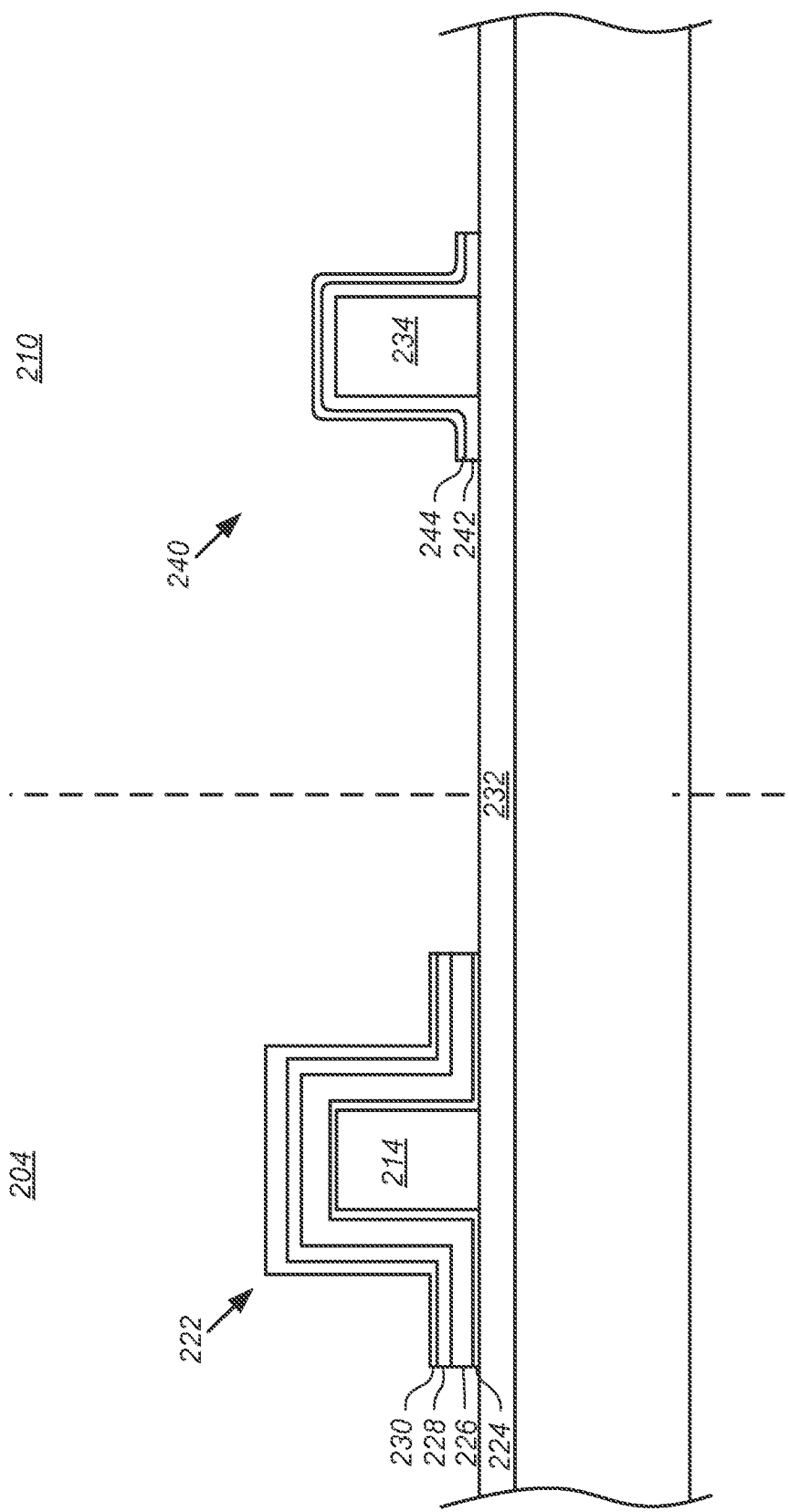

In accordance with the present disclosure, the non-planar multigate memory device 202 of FIG. 2A can include a multi-layer charge-trapping layer and a blocking oxide layer formed by oxidation and consumption of a cap layer and a portion of the charge-trapping layer. FIG. 2B is a cross-sectional view of a portion of the non-planar memory device of FIG. 2A including a portion of the substrate 206, channel 214 and the gate stack 222. The gate stack 222 includes a tunnel dielectric 224 overlying the raised channel 214, a charge-trapping layer 226, a blocking oxide layer 228 and a gate layer 230 overlying the blocking layer to form a control gate of the memory device 202. As described above, the gate layer 230 can include a doped polysilicon or a metal layer. The channel 214 and gate stack 222 can be formed directly on substrate 206 or on an insulating or dielectric layer 232, such as a buried oxide layer, formed on or over the substrate.

Although not shown in these figures, it will be understood the charge-trapping layer 226 can be multi-layer charge-trapping layer including at least one lower or first charge-trapping layer comprising nitride closer to the tunnel dielectric 224, and an upper or second charge-trapping layer overlying the first charge-trapping layer. Generally, the second charge-trapping layer comprises a silicon-rich, oxygen-lean nitride layer and comprises a majority of a charge traps distributed in multiple charge-trapping layers, while the first charge-trapping layer comprises an oxygen-rich nitride or silicon oxynitride, and is oxygen-rich relative to the top charge-trapping layer to reduce the number of charge traps therein. By oxygen-rich it is meant wherein a concentration of oxygen in the first charge-trapping layer is from about 15 to about 40%, whereas a concentration of oxygen in second charge-trapping layer is less than about 5%. In some embodiments, the multi-layer charge-trapping layer further includes at least one thin, intermediate or middle oxide layer separating the second charge-trapping layer from the first charge-trapping layer.

Finally, the blocking oxide layer 228 can include an oxide formed by oxidation and consumption of a cap layer and a portion of the charge-trapping layer 226, as described above with reference to FIGS. 1A-1q.

In the embodiment shown in FIG. 2A, the MOS device 208 is also a finFET, and includes a channel 234 formed from a thin film or layer of semiconducting material overlying the surface 216 of the substrate 206 connecting a source 236 and a drain 238 of the MOS device. The channel 234 is also enclosed on three sides by a fin or gate which forms a gate 240 of the MOS device 208. Referring to FIG. 2B gate 240 of the MOS device 208 includes a gate oxide 242 overlying the raised channel 234 and a metal or doped polysilicon gate layer 244 overlying the gate oxide.

Figure 3:
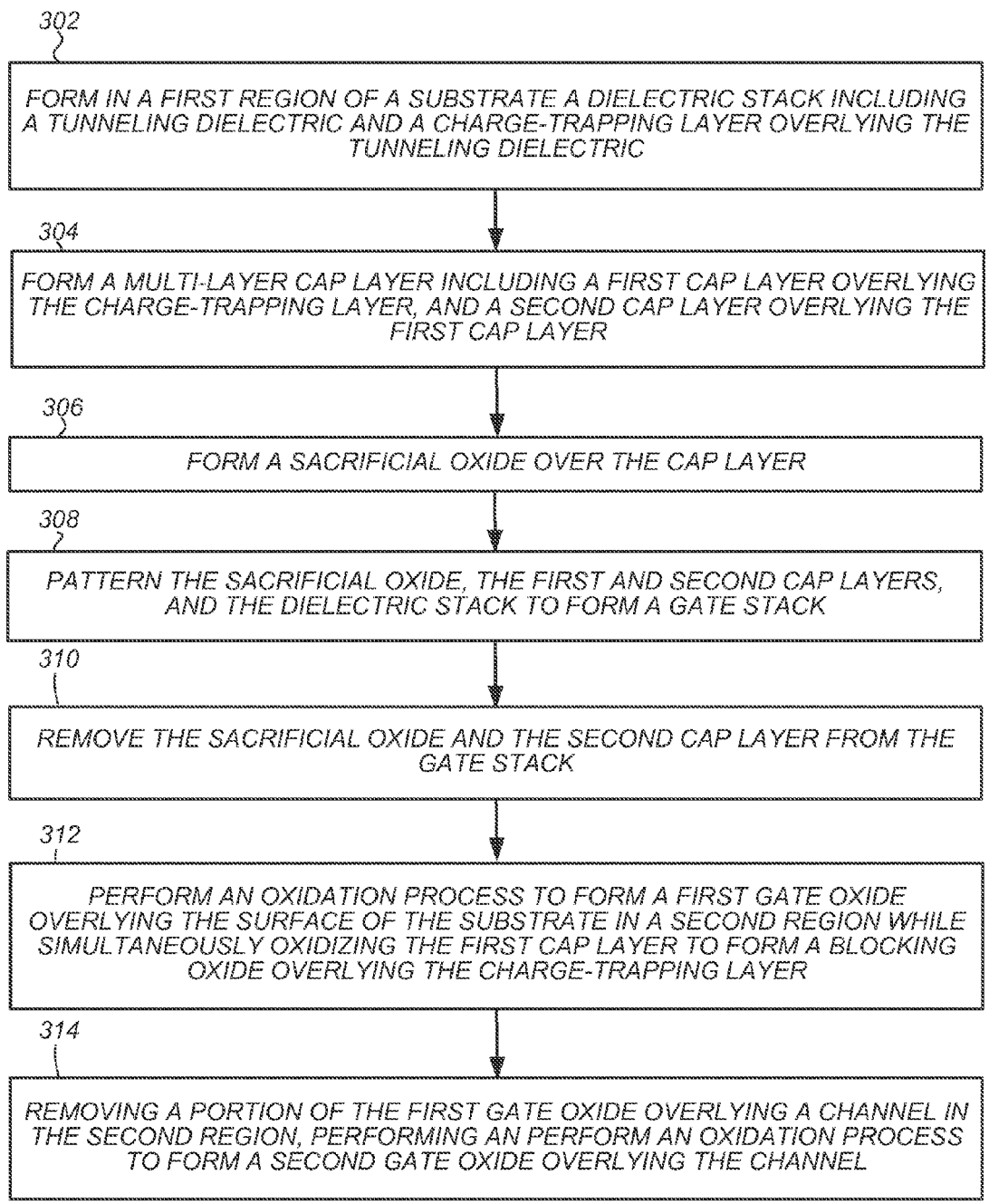
FIG. 3 is a flow diagram depicting sequences of particular modules employed in the fabricating an integrated circuit including a MOSFET and a non-planar, multi-gate non-volatile memory device.

FIG. 3 illustrates a flow diagram depicting sequences of particular modules that may be employed in the fabrication process of a non-volatile charge trap memory device integrated with a logic MOS device, in accordance with either the embodiment shown in FIGS. 1A-1*q*, or the embodiment shown in FIG. 2A or 2B.

Referring to FIG. 3, the method begins with forming a dielectric stack in at least a first region of a substrate, the dielectric stack including a tunneling dielectric overlying a surface of the substrate and a charge-trapping layer overlying the tunneling dielectric (module 302). Next, a multi-layer cap layer is formed including a first cap layer overlying the charge-trapping layer, and a second cap layer overlying the first cap layer (module 304). A sacrificial oxide is formed over the cap layer (module 306), and the sacrificial oxide, the first and second cap layers, and the dielectric stack patterned to form a gate stack in the first region of the substrate, and to remove the sacrificial oxide, cap layer and dielectric stack from a second region of the substrate. (module 308). The sacrificial oxide and the second cap layer are then removed from the gate stack in a wet clean process (module 310). Finally, an oxidation process is performed to form a first gate oxide overlying the surface of the substrate in a second region while simultaneously oxidizing the first cap layer to form a blocking oxide overlying the charge-trapping layer (module 312).

In those embodiments in which the process includes a dual gate oxide process to fabricate both MOS and HV MOS devices in the second region of the substrate, the process further includes removing a portion of the first gate oxide overlying a channel in the second region, and performing an oxidation process to form a thinner, second gate oxide overlying the channel (module 314). As described above with respects to FIGS. 1*k* to 1*l*, this can be accomplished using a patterned mask layer and standard lithographic techniques. The thinner, second gate oxide can be thermally grown to a thickness of from about 1.5 nm to about 3 nm using a thermal oxidation process similar to that used to grow the first gate oxide.

Thus, embodiments of integrated circuit including a MOSFET and a non-volatile memory device including a charge-trapping gate stack and methods of forming the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the hot de-latch system and method of the present disclosure. It will be evident however to one skilled in the art that the present interface device and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the system or method. The appearances of the phrase "one embodiment" in various places in the specification do not necessarily all refer to the same embodiment. The term "to couple" as used herein may include both to directly electrically connect two or more components or elements and to indirectly connect through one or more intervening components.

What is claimed is:

1. A method comprising:
   forming a dielectric stack on a surface of a substrate, the dielectric stack including a tunneling dielectric overlying the surface of the substrate and a charge-trapping layer overlying the tunneling dielectric;
   forming a cap layer overlying the dielectric stack, wherein the cap layer comprises a multi-layer cap layer including at least a first cap layer overlying the charge-trapping layer, and a second cap layer overlying the first cap layer;
   patterning the cap layer and the dielectric stack to form a gate stack of a memory device;
   removing the second cap layer; and
   performing an oxidation process to oxidize the first cap layer to form a blocking oxide overlying the charge-trapping layer, wherein the oxidation process consumes the first cap layer.

2. The method of claim 1, wherein the first cap layer and the second cap layer comprise a material comprising nitride.

3. The method of claim 1, wherein the oxidation process consumes a portion of the charge-trapping layer.

4. The method of claim 1, wherein the oxidation process does not consume substantially any of the charge-trapping layer.

5. The method of claim 1, wherein the charge-trapping layer comprises a multi-layer charge-trapping layer including at least a first charge-trapping layer closer to the tunneling dielectric, and an second charge-trapping layer that is oxygen-lean relative to the first charge-trapping layer and comprises a majority of a charge traps distributed in multi-layer charge-trapping layer.

6. The method of claim 5, wherein the second charge-trapping layer and the cap layer comprise the same material.

7. The method of claim 1, wherein the first cap layer and the second cap layer comprise silicon nitride or silicon oxynitride.

8. A method comprising:
   forming a dielectric stack on a surface of a substrate, the dielectric stack including a tunneling dielectric overlying the surface of the substrate and a charge-trapping layer on the tunneling dielectric;
   forming a cap layer on the charge-trapping layer;
   patterning the cap layer and the dielectric stack to form a gate stack of a memory device in a first region of the substrate and to remove the cap layer and the charge-trapping layer from a second region of the substrate; and
   removing at least a portion of the cap layer in the first region of the substrate;
   performing an oxidation process to form a gate oxide overlying the surface of the substrate in the second region while concurrently oxidizing a remaining portion of the cap layer to form a blocking oxide on the charge-trapping layer.

9. The method of claim 8, wherein the oxidation process consumes substantially all of the remaining portion of the cap layer.

10. The method of claim 8, wherein the oxidation process consumes a portion of the charge-trapping layer.

11. The method of claim 8, wherein the charge-trapping layer comprises a multi-layer charge-trapping layer including at least a first charge-trapping layer closer to the tunneling dielectric, and an second charge-trapping layer that is oxygen-lean relative to the first charge-trapping layer and comprises a majority of a charge traps distributed in multi-layer charge-trapping layer.

12. The method of claim 11, wherein the second charge-trapping layer and the cap layer comprise the same material.

13. The method of claim 8, wherein the cap layer comprises silicon nitride or silicon oxynitride.

14. A method comprising:
forming a dielectric stack in a first region and over a pad oxide in a second region of a substrate, the dielectric stack including a tunneling dielectric overlying a surface of the substrate and a charge-trapping layer on the tunneling dielectric;
forming a cap layer overlying the dielectric stack;
forming a sacrificial oxide over the cap layer;
patterning the sacrificial oxide, cap layer and dielectric stack to form a gate stack in the first region of the substrate, and to remove the sacrificial oxide, cap layer and dielectric stack from the second region of the substrate;
removing the sacrificial oxide from the gate stack while removing the pad oxide from the second region; and
forming a gate oxide overlying the surface of the substrate in the second region using an oxidation process while concurrently oxidizing at least a portion of the cap layer to form a blocking oxide overlying the charge-trapping layer.

15. The method of claim 14, wherein the oxidation process consumes substantially all of the cap layer.

16. The method of claim 15, wherein the oxidation process consumes a portion of the charge-trapping layer.

17. The method of claim 15, wherein the oxidation process does not consume substantially any of the charge-trapping layer.

18. The method of claim 14, wherein the charge-trapping layer comprises a multi-layer charge-trapping layer including at least a first charge-trapping layer closer to the tunneling dielectric, and an second charge-trapping layer that is oxygen-lean relative to the first charge-trapping layer and comprises a majority of a charge traps distributed in multi-layer charge-trapping layer.

19. The method of claim 18, wherein the second charge-trapping layer and the cap layer comprise the same material.

20. The method of claim 14, wherein the first cap layer and the second cap layer comprise silicon nitride or silicon oxynitride.

* * * * *